(12) United States Patent
Jeon

(10) Patent No.: US 7,223,953 B2
(45) Date of Patent: May 29, 2007

(54) IMAGE SENSOR AND METHOD OF MANUFACTURING THE SAME

(75) Inventor: In Gyun Jeon, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 101 days.

(21) Appl. No.: 10/746,499

(22) Filed: Dec. 29, 2003

(65) Prior Publication Data

US 2004/0135067 A1    Jul. 15, 2004

(30) Foreign Application Priority Data

Dec. 30, 2002    (KR) .................... 10-2002-0087281

(51) Int. Cl.
*H01L 27/00* (2006.01)
*H01L 31/00* (2006.01)

(52) U.S. Cl. ................. 250/208.1; 250/214.1
(58) Field of Classification Search ............ 250/214.1, 250/208.1, 214 R; 257/215, 222
See application file for complete search history.

(56) References Cited

U.S. PATENT DOCUMENTS

| | | | | |
|---|---|---|---|---|
| 5,241,169 A | * | 8/1993 | Ohzu | 250/208.1 |
| 5,252,509 A | * | 10/1993 | Hosack | 438/78 |
| 5,710,446 A | | 1/1998 | Chi et al. | 257/225 |
| 5,856,686 A | * | 1/1999 | Watanabe et al. | 257/291 |
| 5,965,875 A | * | 10/1999 | Merrill | 250/226 |
| 6,191,409 B1 | | 2/2001 | Muramatsu | 250/208.1 |
| 6,306,679 B1 | * | 10/2001 | Kang et al. | 438/73 |
| 6,326,653 B1 | * | 12/2001 | Nagata et al. | 257/232 |
| 6,384,398 B1 | * | 5/2002 | Kalnitsky et al. | 250/208.1 |
| 6,563,947 B1 | * | 5/2003 | Droste | 382/181 |
| 2002/0162945 A1 | * | 11/2002 | Chen et al. | 250/214.1 |

* cited by examiner

*Primary Examiner*—Georgia Epps
*Assistant Examiner*—Kevin Wyatt
(74) *Attorney, Agent, or Firm*—Finnegan, Henderson, Farabow, Garrett, & Dunner, L.L.P.

(57) ABSTRACT

An image sensor and a method of manufacturing the same are disclosed. When forming an impurity region for a photodiode, the photodiode can be exposed by reducing the impurity region. Thus, a depletion region of the photodiode, formed when the sensor operates, extends to the exposed surface of the photodiode through the inner region of the photodiode, so that it is possible for the photodiode to normally absorb short wavelength light as well as long wavelength light at its depletion region.

Also, the uniformity of the generation of photo electrons depending on the different colors of lights can be optimized, and the color presentation quality can be further enhanced.

9 Claims, 4 Drawing Sheets

IMAGE SENSOR AND METHOD OF MANUFACTURING THE SAME

This application is based on and claims priority to Korean Patent Application No. 10-2002-0087281, filed on Dec. 30, 2002, the entire contents of which are incorporated herein by reference.

BACKGROUND OF THE INVENTION

1. Field of the Invention

The present invention relates to an image sensor and a method of manufacturing the same.

2. Background of the Related Art

Recently, with a rapid development of the electric/electronic technologies, various electronics, such as video cameras, digital still cameras, minicam adapted personal computers (PC), minicam adapted mobile phones and so forth, employing image sensor technologies have been widely developed and used.

Traditionally, in a conventional image sensor, a charge coupled device (CCD) has been generally used. However, such CCD has drawbacks in high driving voltage, a separate additional support circuit, and high per-unit prices, so that the usage thereof has been on the decrease presently.

Recently, as an image sensor for overcoming the disadvantages of the CCD, attention is attracted to a Complementary Metal Oxide Semiconductor (CMOS) image sensor. Since the CMOS image sensor is manufactured based on CMOS circuit technologies, it, contrary to the existing CCD, has advantages in that it can be driven with low voltage, it does not require an additional support circuit, it has a low per-unit price and so on.

In U.S. Pat. No. 6,191,409, entitled "Image sensor having means for changing predetermined voltage", and U.S. Pat. No. 5,710,446, entitled "Active pixel sensor cell that utilizes a parasitic transistor to reset the photodiode of the cell", examples of CMOS image sensors are represented.

As illustrated in FIG. 1, the prior art CMOS image sensor is formed in an active region of a semiconductor substrate 1, wherein the active region is defined by an isolation 2. The CMOS image sensor includes a photodiode 3 for generating and accumulating photo electrons, and a signal processing transistor 10 for transmitting and emitting photo electrons accumulated in the photodiode 3 to an image processing circuit (not illustrated) Here, the signal processing transistor 10 includes, for example, gate insulating film pattern 11, gate electrode pattern 12, spacer 13, and impurity region 14.

As illustrated in FIG. 1, in the prior art, an impurity region 3a is formed all over a prearranged photodiode region of the semiconductor substrate 1, and a depletion region (DR) is formed during the operation of the sensor. In this case, the impurity region 3a includes, for example, n-type impurity (shown as N+ in the drawings).

Also as shown in FIG. 1, the depletion region (DR) extends toward an inner portion of the semiconductor substrate 1, and is not exposed at the surface of the semiconductor substrate 1. As a result, among the incident lights that are directed to the photodiode 3, only the light with a long enough wavelength L1, for example red light and green light, can reach the depletion region (DR) located deep inside the semiconductor substrate 1, and the light with a short wavelength L2, for example blue light, can't reach the depletion region (DR).

As a result, without any additional complementary measures, the photodiode 3 can perform the generation/accumulation of photo electrons only by absorbing the light with the long enough wavelength L1, for example red light and green light, which reaches the depletion region (DR). And, the photodiode 3 cannot properly perform the generation/accumulation of photo electrons by absorbing the light with the short wavelength L2, for example blue light, which does not reach the depletion region (DR). Thus, the image sensor according to the prior art has a poor quality in color presentation.

SUMMARY OF THE INVENTION

The present invention relates to an image sensor and a method of manufacturing the same, wherein a photodiode of the image sensor can absorb the short wavelength light as well as the long wavelength light at its depletion region (DR).

In order to solve the above-mentioned problems of the prior art, there is provided an image sensor, including: an isolating region and an active region in a semiconductor substrate, wherein the active region includes a prearranged photodiode region; an impurity region, located in a first region of the prearranged photodiode region, for forming a photodiode for generating and accumulating photo electrons, wherein a second region of the prearranged photodiode region is exposed at a surface of the semiconductor substrate; and a signal processing transistor for transmitting and emitting photo electrons accumulated in the photodiode.

Additionally, in order to solve the above-mentioned problems of the prior art, there is provided a method of manufacturing an image sensor, including: defining an active region in a semiconductor substrate by forming an isolation; defining a prearranged photodiode region in the active region; forming an impurity region through selective ion implantation of impurity into a first region of the prearranged photodiode region, thereby forming a photodiode for generating and accumulating photo electrons; and forming a signal processing transistor for transmitting and emitting photo electrons accumulated in the photodiode.

The first region may be a middle portion of the prearranged photodiode region and the second region may be the rest of the prearranged photodiode region excluding the first region.

DETAILED DESCRIPTION OF THE EMBODIMENTS

A purpose of the present invention is to provide an image sensor, wherein a photodiode of the image sensor can receive the short wavelength light as well as the long wavelength light at its depletion region (DR). The above-mentioned purpose is achieved by contracting a portion of an impurity region in a semiconductor substrate, wherein the photodiode is formed by the impurity region and the semiconductor substrate, so that part of the photodiode is exposed at the surface of the semiconductor substrate. Thus, the effective area of the depletion region (DR) of the photodiode extends to the exposed part of the photodiode from the inner area of the photodiode.

Another purpose of the present invention is to provide an image sensor, which enhances a color presentation quality. The above-mentioned purpose is achieved by maximizing the bandwidth of light that may be absorbed, by optimizing the location of the impurity region and the uniformity of the generation of photo electrons according to the different colors of lights.

Other purposes of the present invention will become clear from the accompanying drawings and accompanying description.

The image sensor and the method of manufacturing the same are illustrated in the following detailed description with reference to the accompanying drawings.

Figure 1:
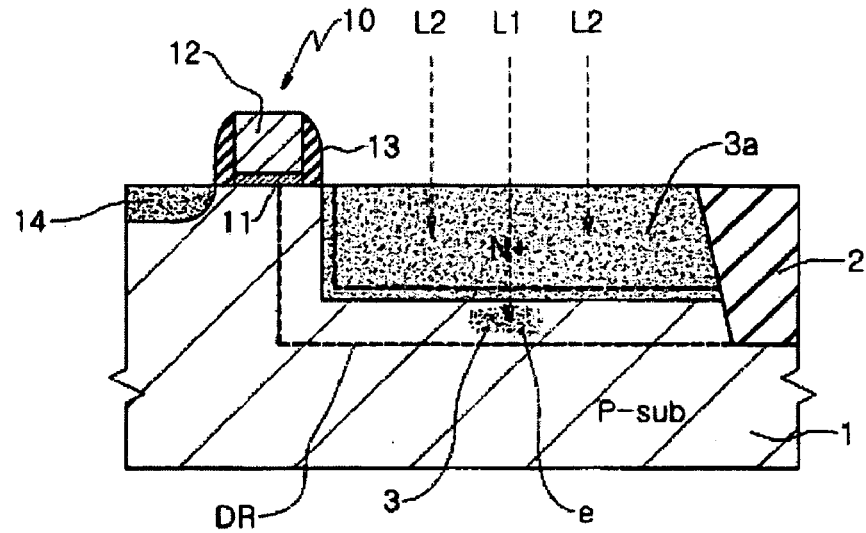
FIG. 1 illustrates a prior art image sensor.
Figure 2:
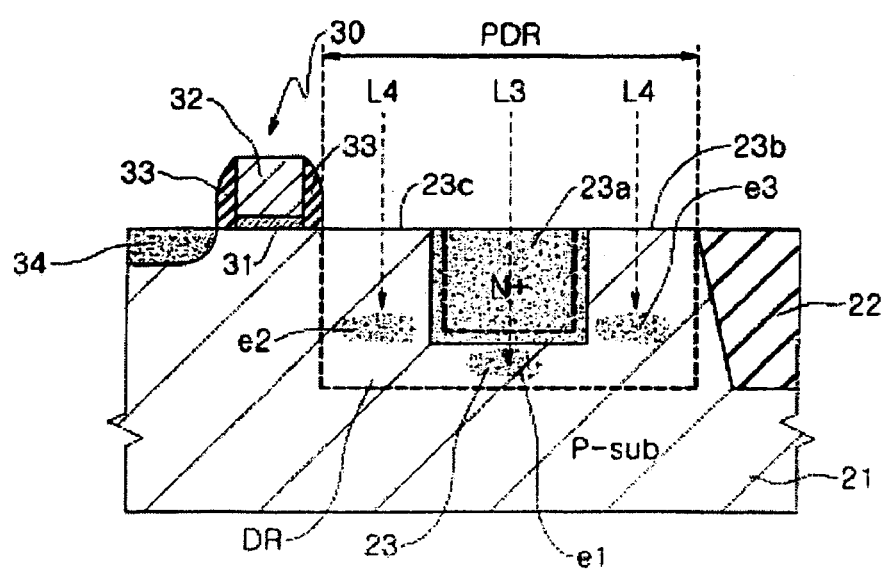
FIG. 2 illustrates an image sensor according to an embodiment of the present invention.

As illustrated in FIG. 2, an image sensor according to present invention includes a photodiode 23 for generating and accumulating photo electrons; and a signal processing transistor 30 for transmitting and emitting photo electrons accumulated in the photodiode 23 to an image processing circuit (not shown). The photodiode 23 is formed in an active region of a semiconductor substrate 21, wherein the active region is defined by an isolation 22, and the signal processing transistor 30 is located near the photodiode 23.

An impurity region 23a is formed in a middle portion of a prearranged photodiode region (PDR) so that a portion of the photodiode 23 is exposed at the surface of the semiconductor substrate 21. Photodiode 23 is formed and spreads beneath the impurity region 23a and is exposed at surface areas 23b and 23c of the prearranged photodiode region (PDR), wherein surface areas 23b and 23c are on the respective sides of the impurity region 23a. As the photodiode 23 is exposed at surface areas 23b and 23c, the depletion region (DR), which is formed during the operation of the sensor, can expand its effective region to both of surface areas 23b, 23c of the semiconductor substrate 21.

In the present invention, the impurity region 23a is formed the middle portion of the prearranged photodiode region (PDR) with the photodiode 23 exposed at the two surface areas 23b and 23c of the prearranged photodiode region (PDR), thus the impurity region 23a is smaller than the prior art. As a result, the depletion region (DR), which is formed during the operation of the sensor, can expand its effective region to both of surface areas 23b, 23c of the semiconductor substrate 21. And among the incident lights that are directed to the photodiode 23, the long wavelength lights L1, e.g., red light and green light, can reach the deep area of the depletion region in the semiconductor substrate 21, and the short wavelength lights L2, e.g. blue light, can properly reach the depletion region (DR) close to the surface of the semiconductor substrate 21.

In this case, the photodiode 23 can generate and accumulate a series of photo electrons e1, e2, e3 regardless of the wavelength of the incident light, the short wavelength lights L2, e.g. blue light, as well as long wavelength lights, e.g. red light and green light. As a result, the image sensor according to the present invention can easily obtain enhanced quality in the overall color presentation.

The concentration of the impurity, e.g., n-type impurity, of the impurity region 23a, is higher than the concentration of the semiconductor substrate 21, and is preferably $1 \times 10^{17}/cm^3 \sim 1 \times 10^{18}/cm^3$, and the surface area of the impurity region 23a, i.e., the middle portion of the prearranged photodiode region, is preferably $0.25\ \mu m^2 \sim 4.0\ \mu m^2$.

Hereinafter, a method of manufacturing an image sensor according to the present invention is described in more detail.

As illustrated in FIGS. 3a to 3e, the method of manufacturing an image sensor according to the present invention includes: defining an active region (AR) of a semiconductor substrate 21 by forming an isolation 22; defining a prearranged photodiode region (PDR); forming an impurity region 23a through selective ion implantation of impurity ions in a first region of the prearranged photodiode region, thereby forming a photodiode 23, which spreads beneath the impurity region 23a and is exposed at a second region of the prearranged photodiode region; and forming a signal processing transistor 30 for transmitting and emitting photo electrons accumulated in the photodiode 23. Here, the first region is a middle portion of the prearranged photodiode region and the second region is the rest of the prearranged photodiode region excluding the first region.

Figure 3A:
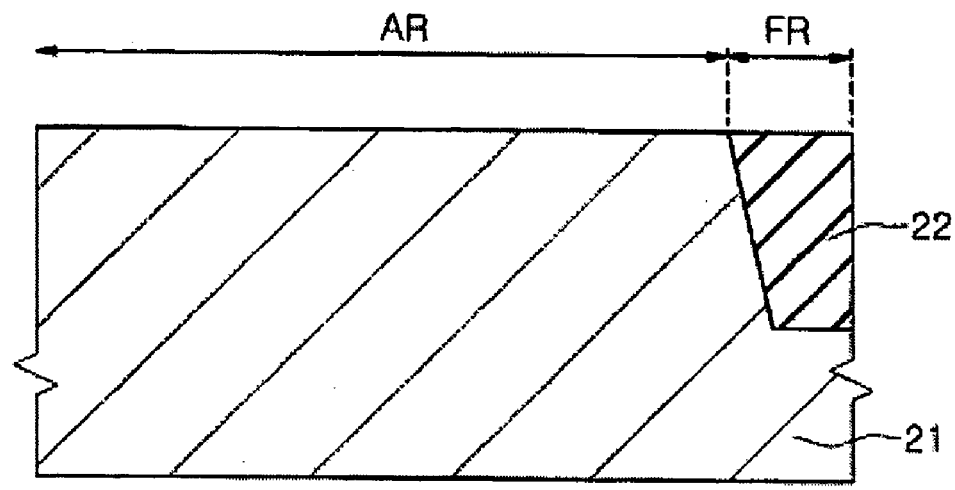
FIGS. 3a to 3e illustrate a method of manufacturing an image sensor according to an embodiment of the present invention.

As illustrated in FIG. 3a, the present invention forms trenches in an isolating region (FR) using a series of sacrificial layer patterns, e.g. sacrificial nitride layer pattern, sacrificial oxide layer pattern. And then, the present invention forms an isolation 22, which defines the active region (AR), by filling the internal areas of the trenches by gap filling process, patterning process etc.

Shallow Trench Isolation process (STI process) for forming isolation 22 can be substituted by the Local Oxidation of Silicon process (LOCOS process).

Figure 3B:
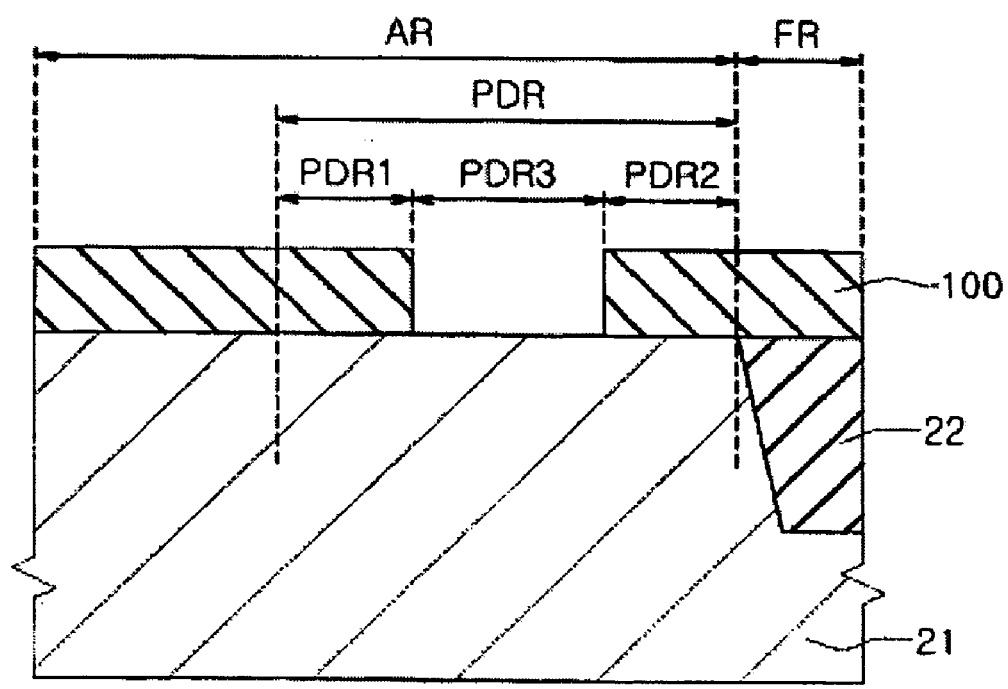

As illustrated in FIG. 3b, after forming the above-mentioned active region (AR), a photoresist pattern 100 is formed on the semiconductor substrate 21. Here, the opening of the photoresist pattern 100 is positioned at a middle area (PDR3) of the prearranged photodiode region (PDR), with both side areas (PDR1, PDR2) covered with photoresist pattern 100.

Figure 3C:
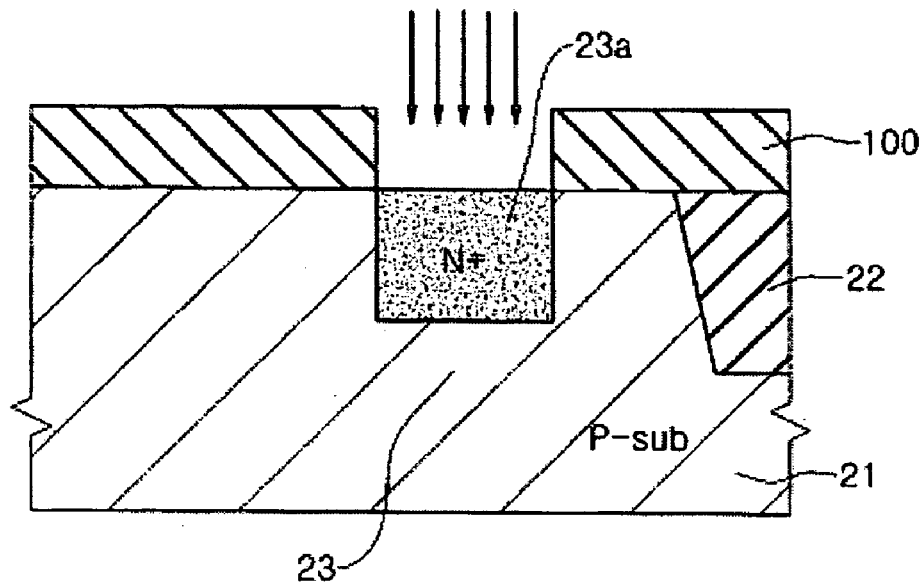

As illustrated in FIG. 3c, the impurity implantation process is performed using the photoresist pattern 100 as a mask, so that an impurity region 23a is formed to in the middle portion PDR3 of the prearranged photodiode region (PDR) with both side areas PDR1 and PDR2 of the prearranged photodiode region (PDR) exposed. Then, the photoresist pattern 100 is removed.

Figure 3D:
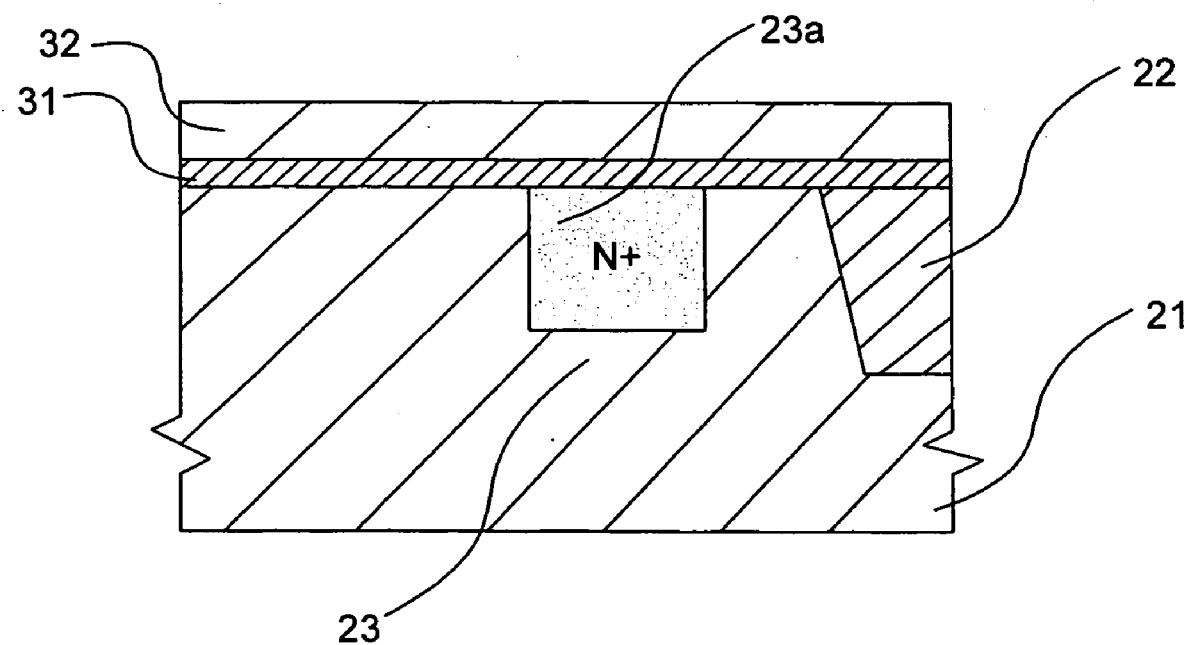

As illustrated in FIG. 3d, thermal oxidation process or low pressure chemical vapor deposition, is performed to form an insulating film 31 on the surface of the semiconductor substrate 21. Then, low pressure CVD process is performed to form polycrystalline silicon layer 32 on the insulating film 31.

Figure 3E:
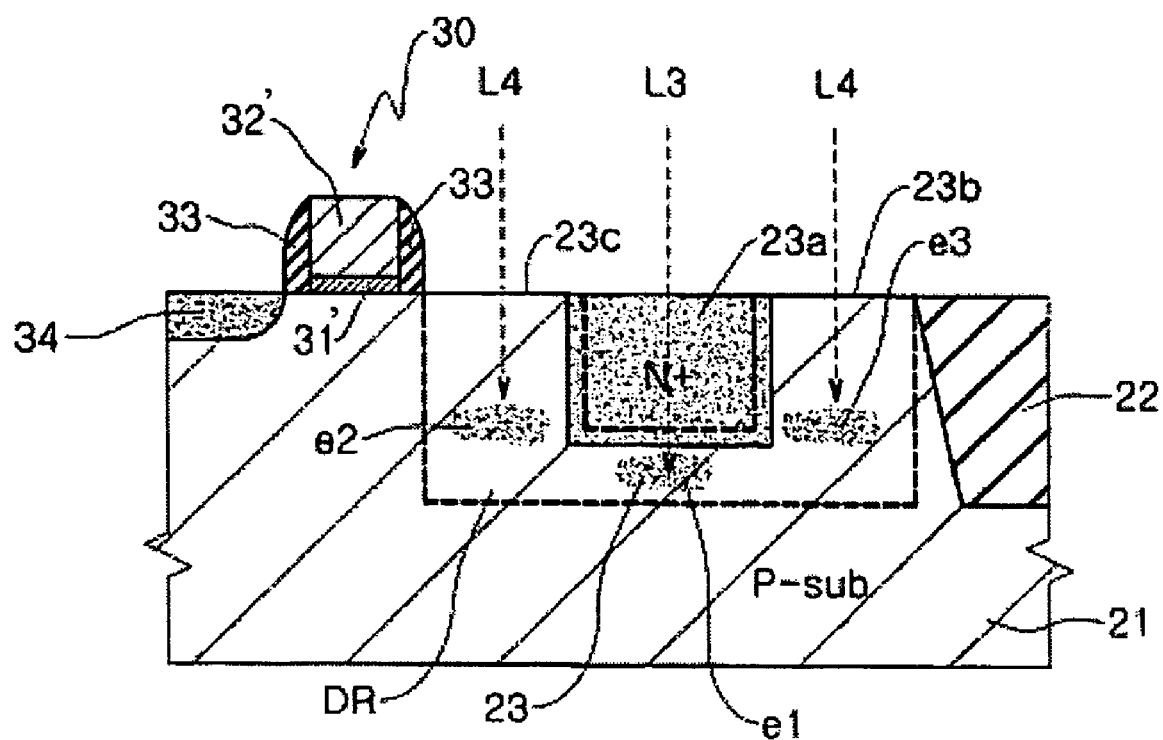

Then, as illustrated in FIG. 3e, gate insulating film 31' and gate electrode pattern 32' are formed on the active region of the semiconductor substrate 21 next to the photodiode 23, by patterning the insulating film 31 and polycrystalline silicon layer 32 through photolithography process.

Then, an insulating film is formed on the semiconductor substrate 21 using a low-pressure CVD process, wherein the insulating film covers the gate electrode pattern 32. Spacer 33 is formed on the side wall of the gate electrode pattern 32' using an anisotropic dry etching process, e.g. reactivity ion etching process.

Then, a high-concentration ion implantation process is performed with the spacer 33 being used as a mask to form an impurity region 34 at the side of the gate electrode pattern 32'. Finally, signal processing transistor 30 for transmitting and emitting photo electron which is accumulated in the photodiode 23 is completely produced.

Though not illustrated in the drawings for the sake of convenience, the image sensor according to the present invention may include a plurality of signal processing transistors 30.

The depletion region (DR), which is formed during the operation of the sensor, can expand its effective region to both surface areas 23b, 23c of side areas PDR1 and PDR2.

Therefore, among the incident lights that are directed to the photodiode 23, both the short wavelength lights L2, e.g. blue light, and the long wavelength lights L1, e.g. red light and green light, can properly reach the depletion region (DR).

Then, a series of subsequent processes such as insulating film forming process, contact hole forming process, metallization process, interlayer insulating film forming process, color pattern forming process, planarization film forming process, micro lens array forming process, etc., are further performed to complete the image sensor according to the present invention.

As illustrated above, according to the present invention, when forming an impurity region for a photodiode, part of the photodiode can be exposed by reducing the impurity region. Thus, a depletion region, formed when the sensor operates, extends to the exposed surface of the photodiode and through an inner region of the semiconductor substrate. Therefore, it is possible for the photodiode to absorb short wavelength light as well as long wavelength light at its depletion region.

Further, according to the present invention, the uniformity of the generation of photo electrons depending on the different colors of lights can be optimized, and finally the color presentation quality can be further enhanced.

The forgoing described embodiment is merely exemplary and is not to be construed as limiting the present invention. The present teachings can be readily applied to other types of apparatuses. The description of the embodiments of the present invention is intended to be illustrative, and not to limit the scope of the claims. Alternatives, modifications, and variations will be apparent to those skilled in the art.

What is claimed is:

1. An image sensor, comprising:
    an isolating region and an active region in a semiconductor substrate, wherein the active region includes a photodiode formed in a prearranged photodiode region for generating and accumulating photoelectrons, the prearranged photodiode region including a first region in a middle portion thereof and a second region comprising a remaining portion thereof;
    an impurity region formed in the first region of the prearranged photodiode region, wherein the photodiode comprises the impurity region and a depletion region generated in the second region during an operation of the image sensor, portions of the depletion region being exposed at a surface of the substrate on both sides of the impurity region, wherein the depletion region is formed to not extend below an insulating layer; and
    a signal processing transistor for transmitting and emitting photo electrons accumulated in the photodiode.

2. The image sensor according to claim 1, wherein the impurity region is of n-type.

3. The image sensor according to claim 1, wherein a concentration of the impurity region is higher than a concentration of the semiconductor substrate.

4. The image sensor according to claim 3, wherein the concentration of the impurity region is $1\times10^{17}/cm^3 \sim 1\times10^{18}/cm^3$.

5. The image sensor according to claim 1, wherein a surface area of the impurity region is $0.25\ \mu m^2 \sim 4.0\ \mu m^2$.

6. The method of manufacturing an image sensor, comprising:
    defining an active region in a semiconductor substrate by forming an isolation;
    defining a prearranged photodiode region in the active region;
    forming an impurity region through selective ion implantation of impurity ions into a middle portion of the prearranged photodiode region, wherein, during an operation of the image sensor, a depletion region is formed in a portion of the prearranged photodiode region surrounding the impurity region, portions of the depletion region being exposed to a surface of the substrate on both sides of the impurity region, wherein the depletion region is formed to not extend below an insulating layer; and
    forming a signal processing transistor for transmitting and emitting photo electrons accumulated in the photodiode.

7. The method according to claim 6, wherein the impurity region is of n-type.

8. The method according to claim 6, wherein a concentration of the impurity region is higher than the concentration of the semiconductor substrate.

9. The method according to claim 8, wherein a concentration of the impurity region is $1\times10^{17}/cm^3 \sim 1\times10^{18}/cm^3$.

* * * * *